(12) United States Patent
Cave et al.

(10) Patent No.: US 9,844,055 B2
(45) Date of Patent: *Dec. 12, 2017

(54) MOBILE COMMUNICATION SYSTEM AND METHOD FOR PROVIDING COMMON CHANNEL COVERAGE USING BEAMFORMING ANTENNAS

(71) Applicant: INTERDIGITAL TECHNOLOGY CORPORATION, Wilmington, DE (US)

(72) Inventors: Christopher R Cave, Montreal (CA); Marian Rudolf, Montreal (CA)

(73) Assignee: InterDigital Technology Corporation, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 15/221,904

(22) Filed: Jul. 28, 2016

(65) Prior Publication Data

US 2016/0338058 A1 Nov. 17, 2016

Related U.S. Application Data

(63) Continuation of application No. 14/840,469, filed on Aug. 31, 2015, now Pat. No. 9,414,383, which is a (Continued)

(51) Int. Cl.
*H04W 4/00* (2009.01)
*H04W 72/04* (2009.01)
(Continued)

(52) U.S. Cl.
CPC ..... *H04W 72/0446* (2013.01); *H01L 27/1462* (2013.01); *H01L 27/14603* (2013.01);
(Continued)

(58) Field of Classification Search
USPC ........ 370/329, 338, 333, 330, 331; 455/436, 455/67.11, 525, 337, 437, 562.1, 443,
(Continued)

(56) References Cited

U.S. PATENT DOCUMENTS 4,723,266 A 2/1988 Perry
5,054,035 A 10/1991 Tarallo et al.
(Continued)

FOREIGN PATENT DOCUMENTS

EP 0 932 319 7/1999
EP 1 005 190 5/2000
(Continued)

OTHER PUBLICATIONS

Balbach, "UMTS—Competing Navigation System and Supplemental Communication System to GNSS," ION GPS Meeting, Salt Lake City, U.S.A. (Sep. 19-22, 2000).
(Continued)

*Primary Examiner* — Zewdu A Beyen
(74) *Attorney, Agent, or Firm* — Volpe and Koenig, P.C.

(57) ABSTRACT

A wireless transmit/receive unit (WTRU) includes circuitry configured to receive information from a base station indicating an assignment of periodic time slots to transmit sounding signals and circuitry configured to transmit sounding signals to the base station in the assigned periodic time slots in response to the received information, wherein a timing of transmission of the sounding signals in response to the received information differs between a time division duplex mode and a frequency division duplex mode, and wherein the transmitted sounding signals are distinguishable from sounding signals from other WTRUs.

15 Claims, 5 Drawing Sheets

Related U.S. Application Data continuation of application No. 14/511,682, filed on Oct. 10, 2014, now Pat. No. 9,125,204, which is a continuation of application No. 13/539,858, filed on Jul. 2, 2012, now Pat. No. 8,861,466, which is a continuation of application No. 10/626,165, filed on Jul. 24, 2003, now Pat. No. 8,213,994.

(60) Provisional application No. 60/401,697, filed on Aug. 7, 2002.

(51) Int. Cl.

| | | |
|---|---|---|
| H01L 27/146 | (2006.01) | |
| H04L 5/00 | (2006.01) | |
| H04L 5/14 | (2006.01) | |
| H04W 16/28 | (2009.01) | |
| H04W 74/00 | (2009.01) | |
| H04W 88/10 | (2009.01) | |
| H04W 84/04 | (2009.01) | |

(52) U.S. Cl.
CPC .. *H01L 27/14609* (2013.01); *H01L 27/14689* (2013.01); *H04L 5/0051* (2013.01); *H04L 5/0073* (2013.01); *H04L 5/14* (2013.01); *H04L 5/1415* (2013.01); *H04W 16/28* (2013.01); *H04W 72/042* (2013.01); *H04W 72/0413* (2013.01); *H04W 74/006* (2013.01); *H04W 84/042* (2013.01); *H04W 88/10* (2013.01)

(58) Field of Classification Search
USPC .............................................. 455/450, 575.7
See application file for complete search history.

(56) References Cited

U.S. PATENT DOCUMENTS

| | | | |
|---|---|---|---|
| 5,095,535 A | | 3/1992 | Freeburg |
| 5,214,789 A | | 5/1993 | George |
| 5,267,261 A | | 11/1993 | Blakeney et al. |
| 5,327,575 A | | 7/1994 | Menich et al. |
| 5,375,140 A | | 12/1994 | Bustamante et al. |
| 5,396,541 A | | 3/1995 | Farwell et al. |
| 5,515,366 A | * | 5/1996 | Chieu .................. H04B 7/2656 370/347 |
| 5,615,409 A | | 3/1997 | Forssen et al. |
| 5,634,192 A | | 5/1997 | Meche et al. |
| 5,732,358 A | | 3/1998 | Sawaya et al. |
| 5,867,478 A | | 2/1999 | Baum et al. |
| 5,893,033 A | | 4/1999 | Keskitalo et al. |
| 6,014,565 A | | 1/2000 | Bonta |
| 6,052,064 A | | 4/2000 | Budnik et al. |
| 6,088,590 A | | 7/2000 | Anderson et al. |
| 6,108,323 A | | 8/2000 | Gray |
| 6,108,561 A | | 8/2000 | Mallinckrodt |
| 6,169,903 B1 | * | 1/2001 | Dorenbosch .......... H04W 64/00 455/456.5 |
| 6,195,037 B1 | | 2/2001 | Gross et al. |
| 6,240,290 B1 | | 5/2001 | Willingham et al. |
| 6,330,459 B1 | | 12/2001 | Crichton et al. |
| 6,347,234 B1 | | 2/2002 | Scherzer |
| 6,353,601 B1 | | 3/2002 | Siira |
| 6,445,917 B1 | | 9/2002 | Bark et al. |
| 6,512,481 B1 | | 1/2003 | Velazquez et al. |
| 6,580,910 B1 | | 6/2003 | Mazur et al. |
| 6,593,880 B2 | | 7/2003 | Velazquez et al. |
| 6,826,414 B1 | | 11/2004 | Reynolds et al. |
| 6,834,192 B1 | | 12/2004 | Watanabe et al. |
| 6,842,803 B2 | | 1/2005 | Schmidt et al. |
| 6,999,771 B1 | * | 2/2006 | Kasapi ................ H04W 72/046 455/450 |
| 2001/0003443 A1 | | 6/2001 | Velazquez et al. |
| 2002/0045449 A1 | | 4/2002 | Oobayashi |
| 2002/0068565 A1 | | 6/2002 | Pumadi et al. |
| 2003/0114195 A1 | | 6/2003 | Chitrapu et al. |
| 2003/0137453 A1 | * | 7/2003 | Hannah .................... G01S 1/24 342/387 |
| 2003/0198253 A1 | | 10/2003 | Ahmed |
| 2004/0142691 A1 | | 7/2004 | Jollota et al. |
| 2005/0066034 A1 | | 3/2005 | Beckmann et al. |

FOREIGN PATENT DOCUMENTS

| | | |
|---|---|---|
| EP | 1 223 776 | 7/2002 |
| GB | 2 317 786 | 4/1998 |
| WO | 02/41652 | 5/2002 |
| WO | 2004/054153 | 6/2004 |

OTHER PUBLICATIONS

Steer et al., "Location Services Architecture for Future Mobile Networks," Vehicular Technology Conference Proceedings, vol. 2, pp. 1362-1366 (May 15-18, 2000).

Vaughan et al., "Super-Resolution of Pulsed Multipath Channels for Delay Spread Characterization," IEEE Transactions on Communications, vol. 47, pp. 343-347 (Mar. 1999).

Wang et al., "Soft Handoff Analysis of CDMA Systems Using Novel Switched-Beam Smart Antennas With Polarization Diversity", IEEE Vehicular Technology Conference, vol. 1 of 4, Conf. 53, May 2001, pp. 243-247.

* cited by examiner

MOBILE COMMUNICATION SYSTEM AND METHOD FOR PROVIDING COMMON CHANNEL COVERAGE USING BEAMFORMING ANTENNAS

CROSS REFERENCE TO RELATED APPLICATIONS

This application is a continuation of U.S. patent application Ser. No. 14/840,469 filed Aug. 31, 2015, which is a continuation of U.S. patent application Ser. No. 14/511,682 filed Oct. 10, 2014, which issued as U.S. Pat. No. 9,125,204 on Sep. 1, 2015, which is a continuation of U.S. patent application Ser. No. 13/539,858, filed Jul. 2, 2012, which issued as U.S. Pat. No. 8,861,466 on Oct. 14, 2014, which is a continuation of U.S. patent application Ser. No. 10/626,165, filed Jul. 24, 2003, which issued as U.S. Pat. No. 8,213,994 on Jul. 3, 2012, which claims the benefit of U.S. Provisional Patent Application No. 60/401,697, filed Aug. 7, 2002, which are incorporated by reference as if fully set forth herein.

FIELD OF INVENTION

The present invention relates to mobile communication systems. More particularly, the present invention relates to wireless communication systems that supporting mobile unit communications and a method of increasing capacity through the use of base stations with beamforming or "smart" antennas.

BACKGROUND

Wireless communication systems are well known in the art. Generally, such systems comprise communication stations which transmit and receive wireless communication signals between each other. Typically, base stations are provided which are capable of conducting wireless concurrent communications with a plurality of subscriber stations generically known as wireless transmit/receive units (WTRUs), which include mobile units. Generally, the term base station includes, but is not limited to, a base station, Node-B, site controller, access point, or other interfacing device in a wireless environment. The term WTRU includes, but is not limited to, a user equipment, mobile station, fixed or mobile subscriber unit, pager, or any other type of device capable of operating in a wireless environment.

In Universal Mobile Telecommunications Systems (UMTS) as specified by the Third Generation Partnership Project (3GPP), base stations are called Node Bs, subscriber stations are called User Equipments (UEs) and the wireless CDMA (Code Division Multiple Access) interface between the Node Bs and UEs is known as the Uu interface.

A typical UMTS system architecture in accordance with current 3GPP specifications is depicted in FIG. 1a. The UMTS network architecture includes a Core Network (CN) interconnected with a UMTS Terrestrial Radio Access Network (UTRAN) via an interface known as Iu which is defined in detail in the current publicly available 3GPP specification documents.

The UTRAN is configured to provide wireless telecommunication services to users through UEs via the Uu radio interface. The UTRAN has base stations, Node Bs, which collectively provide for the geographic coverage for wireless communications with UEs. In the UTRAN, groups of one or more Node Bs are connected to a Radio Network Controller (RNC) via an interface known as Iub in 3GPP. The UTRAN may have several groups of Node Bs connected to different RNCs. Two RNCs are shown in the example depicted in FIG. 1a. Where more than one RNC is provided in a UTRAN, inter-RNC communication is performed via an Iur interface.

In existing systems, when a mobile unit is first turned on or traverses into a region of multiple base station coverage, a determination must be made as to which base station the mobile unit will be paired for conducting wireless communication. Depending upon system design, the mobile unit, the communications network or the base stations will determine the pairing between each mobile unit and a base station.

In one type of configuration, a mobile unit monitors common signals from all base stations that it receives and synchronizes itself to the base station with the best quality of service signal (QoS). In such systems, a beacon signal radiated by each base station is an omnidirectional high powered transmission that has a tendency to generate interference.

Smart antennas that include beamforming capability are widely regarded as a promising technology for enhancing capacity and/or coverage of wireless radio access systems, such as 3GPP mobile communications systems. The distinguishing feature of a wireless radio access system employing smart antennas is that a user may be spatially isolated. Radio transmissions directed toward, or received from, a user are isolated in such a way that to minimalize interference to or from other users. FIG. 1b illustrates a smart antenna of a Node B focused at a UE of a 3GPP system.

Wireless radio access systems, such as UMTSs that employ smart antennas, derive two-fold system-level benefits by using highly focused directional antennas. First, the system capacity improves as a result of the reduction in generated interference. Second, the system coverage improves, resulting in an enhanced link budget. The increase in radio coverage from the use of smart antenna technology represents a particularly attractive feature for wireless communications systems. The application of smart antenna technology, including beamforming, is rather straightforward once a radio link is established between a mobile and a radio access point to exchange information over a dedicated channel.

In addition to dedicated radio links, common channels are typically employed in wireless radio access systems. Common channels are established for various purposes, such as: (1) allowing for the temporal or frequency synchronization of mobiles, for example, a 3GPP shared synchronization channel (SCH); (2) broadcasting of system information that is essential for registration to the network upon power-up, for example on a 3GPP broad cast channel (BCH); and (3) paging of idle-mode mobiles, for example on a 3GPP paging indicator channel (PICH), paging channel (PCH), and forward access channel (FACH).

In a statistical sense, the geographical coverage that is provided by downlink common channels defines the coverage area of a base station, which in UMTS, is commonly referred to as a cell. More specifically, the service area provided by a wireless radio access system is determined from the coverage of common channels.

A significant increase in cell area covered by a wireless radio access system using smart antenna technology is enabled by employing highly directional antennas that boost the gain of such systems. Directional antenna gain is achievable when the position of an antenna may be estimated by its peer antenna, and vice versa. Such circumstances are generally fulfilled when a dedicated radio link is established between a mobile and a radio access point.

The usage of smart antennas for the transmission and reception of common channels is not defined in wireless radio access systems existing 3GPP specifications and the advantages resulting from the use of smart antenna technology have yet to be exploited for the transmission and reception of common channels. A reason for this is that coverage of common channels, such as BCH and PICH, must be guaranteed for all mobiles, including those for which the location is unknown. More specifically, a radio access network must ensure that all mobiles may reliably synchronize with the network, read broadcast information, and monitor pages, to name a few. This complication results in wireless radio access systems that transmit common channels using conventional omnidirectional antennas that cover entire cells or cell sectors.

In order to match the extended coverage of dedicated channels using smart antennas, the transmission power of downlink common channels may be increased. However, an increase in transmission power by all radio access points, for example, base stations, also results in an increase in interference. Such a solution is ineffective in wireless radio access systems that are limited by interference. The present preferred solution takes advantage of smart antenna technology to extend coverage while minimizing interference.

SUMMARY

The present invention makes use of smart antenna technology, including beamforming for a wireless radio access system. The functionality of smart antennas for radio links is preferably applied to common channels, resulting in a significant increase in cell coverage. An omnidirectional sounding pulse is used in connection with initiating mobile unit wireless communications. The sounding pulse, a radio frequency (RF) signal with or without intelligence, should not be confused with conventional mobile unit uplink channels.

In one embodiment, a radio network is provided that has a plurality of base stations, each providing wireless communication services in a respective geographic coverage area that may or may not overlap with the geographic coverage areas of other of the base stations. An interface is connected to the base stations.

A wireless communication is established by first transmitting an omnidirectional sounding pulse from a wireless mobile unit located in a geographic coverage area of at least one of the base stations. Information related to the detected sounding pulse is communicated to the interface by each base station detecting the sounding pulse. One of the base stations that detected the sounding pulse is selected for mobile unit communication based on the communicated information. The selected base station directs a communication beam to the mobile unit to establish wireless communication.

In one non-limiting example of the first embodiment, the radio network is a UMTS Terrestrial Radio Access Network (UTRAN), each base station is a Node B, the interface is a Radio Network Controller (RNC), and the mobile unit is a mobile User Equipment (UE). In such case, the communicating of related sounding pulse information is between Node Bs and the RNC via an Iub or a combination Iubdur interface via another RNC. The base station selection is preferably performed by the RNC by selecting a Node B and the communication established between the selected Node B and the UE is via a Uu interface.

Preferably, each base station has a selectively operable beamforming antenna. The establishment of a wireless communication then includes determining a relative location of the mobile unit with respect to the beamforming antenna of the selected base station based on information related to the detected sounding pulse. Accordingly, in directing of a communication beam, the selected base station's antenna is operated to form a communication beam covering a selected portion of the coverage area serviced by the selected base station that encompasses the relative location of the mobile unit.

The formed communication beam preferably carries common channels. In such case, the selected base station's antenna is operated to form a communication beam that encompasses the relative location of the mobile unit such that other mobile units with which the selected base station is conducting wireless communication are also encompassed within the formed communication beam so that the formed beam provides common channel service to a plurality of mobile units.

If the mobile unit does not receive a directed communication beam from a base station within a predefined time period from its transmitting of an omnidirectional sounding pulse, the communication initiation is preferably restarted. Accordingly, the mobile unit is configured to transmit an omnidirectional sounding pulse to initiate communication with a base station and to transmit a subsequent sounding pulse which may be of increased power if a communication beam from a base station that detected a sounding pulse is not established.

Also, the mobile units are preferably configured to monitor the power level of a communication with a base station and to repeat the communication initiation if the monitored power level falls below a predefined level. Additionally, the mobile units may be configured to transmit a series of omnidirectional sounding pulses of increasing power to initiate communication with a base station.

An omnidirectional sounding pulse may be transmitted from each of a plurality of mobile units. In such case, information related to each distinguishable sounding pulse from each respective mobile unit detected by a base station is communicated to a respective selecting interface. Each respective interface selects a base station for each respective mobile unit communication based on the information related to the distinguishable detected sounding pulse of the respective mobile unit from each base station that detected a distinguishable sounding pulse of the respective mobile unit. For each respective mobile unit for which at least one base station received a distinguishable sounding pulse, a communication beam from the respective selected base station is directed to the mobile unit to establish wireless communication.

Preferably, the formed communication beams carry common channels. In some instances, a first base station is selected for communication with a first mobile unit and is also selected for communication with a second mobile unit. The first base station's antenna is then operated to form a communication beam that encompasses the relative location of both the first and second mobile units so that the formed beam provides common channel service to both first and second mobile units. In other instances, a first base station is selected for communication with a first mobile unit by a first selected interface and a second base station is selected for communication with a second mobile unit by a second selected interface.

When at least one base station receives the sounding pulse, measurements may be made to determine a received power level and an estimate of the angle of arrival to the mobile unit. This information from one or more base stations may be used to determine the mobile unit's relative location and to accordingly direct a communication beam toward the mobile unit.

In a second embodiment, the mobile unit selects the base station with which it will establish wireless communication. As in the first embodiment, an omnidirectional sounding pulse is transmitted from the mobile unit located in a geographic coverage area of at least one of the base stations. A communication beam is directed from base stations detecting the sounding pulse towards the mobile unit. One of the base stations that detected the sounding pulse is then selected based on the communication beams received by the mobile unit. A wireless communication is then established between the selected base station and the mobile unit.

The implementing radio network may have a controlling interface connected to the base stations. In such case, the information related to the detected sounding pulse may be communicated to the interface by each base station detecting the sounding pulse. One or more of the base stations that detected the sounding pulse may then be chosen based on the communicated information so that only the chosen base stations direct a communication beam to the mobile unit. In this way, the radio access network may selectively limit the selection made by the mobile unit.

A preferred mobile includes a transmitter configured to transmit an omnidirectional sounding pulse and a receiver for receiving communication beams from base stations that detected a sounding pulse transmitted by the mobile unit. To implement the second embodiment, the mobile unit includes a processor configured to select a base station with which to establish a wireless communication based on communication beams received by the mobile unit from base stations that detected a sounding pulse transmitted by the mobile unit.

Each mobile unit may be equipped with a global positioning system (GPS). In such case, the mobile units are preferably configured to transmit an omnidirectional sounding pulse that includes mobile unit location information determined by its GPS. The mobile units may also be configured to transmit an omnidirectional sounding pulse that includes mobile unit identification information.

A wireless transmit/receive unit (WTRU) includes circuitry configured to receive information from a base station indicating an assignment of periodic time slots to transmit sounding signals and circuitry configured to transmit sounding signals to the base station in the assigned periodic time slots in response to the received information, wherein a timing of transmission of the sounding signals in response to the received information differs between a time division duplex (TDD) mode and a frequency division duplex (FDD) mode, and wherein the transmitted sounding signals are distinguishable from sounding signals from other WTRUs.

A method includes receiving information from a base station by a WTRU, the information indicating an assignment of periodic time slots to transmit sounding signals, and transmitting sounding signals by the WTRU to the base station in the assigned periodic time slots in response to the received information, wherein a timing of transmission of the sounding signals in response to the received information differs between a TDD mode and a FDD mode, and wherein the transmitted sounding signals are distinguishable from sounding signals from other WTRUs.

A base station includes circuitry configured to transmit information to a plurality of WTRUs, wherein the information transmitted to each of the WTRUs indicates an assignment of periodic time slots to transmit sounding signals, and circuitry configured to receive sounding signals from the plurality of WTRUs in their respective assigned periodic time slots in response to the transmitted information, wherein a timing of transmission of the sounding signals differs between a TDD mode and a FDD mode, and wherein the received sounding signals from each WTRU are distinguishable from other WTRUs.

Other objects and advantages of the present invention will be apparent to those skilled in the art from the following detailed description and related drawings.

BRIEF DESCRIPTION OF THE DRAWINGS

A more detailed understanding of the invention may be had from the following description of preferred embodiments, given by way of example and to be understood with reference to the accompanying drawings, in which.

DETAILED DESCRIPTION

Figure 1A:
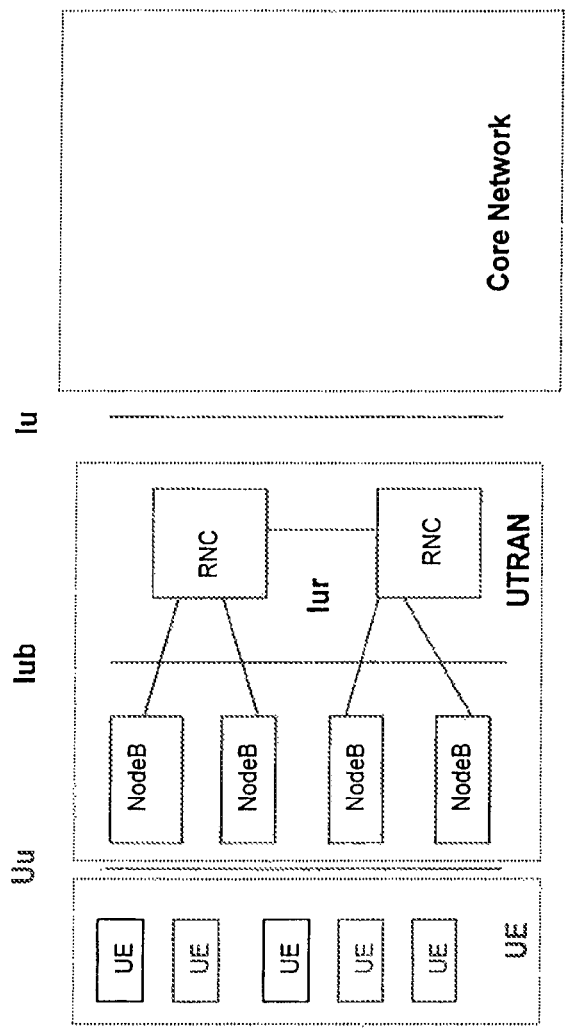
FIG. 1a depicts a typical UMTS system architecture in accordance with current 3GPP specifications.

The present invention is described with reference to the drawing figures wherein like numerals represent like elements throughout. The present invention may be applied to some or all of a systems' downlink common channels. For reason of simplicity, the invention as applied to a UMTS system for downlink common channels is described herein. However, the proposed invention is applicable in any wireless system.

The present invention provides a wireless radio access network having networked base stations with an improved base station selection mechanism for mobile units, i.e., mobile WTRUs, as they enter and/or travel through the respective areas of geographic coverage provided by the respective base stations. Such mobile units, for example, the UEs illustrated in FIG. 1a, generally include a transmitter, a receiver, and a communication signal processor. The network preferably includes some type of base station interface that makes the selection. Such an interface for Node Bs of a 3GPP network is a Radio Network Controller (RNC). However, an alternative embodiment provides for self-selection by the mobile unit.

In lieu of providing complete uniform coverage throughout an entire cell or cell sector, a base station selectively directs at least some, but preferably all, downlink common channels toward individual mobile units using smart antenna technology, including beamforming. FIG. 1b illustrates such coverage in a 3GPP system by a Node B for a mobile unit UE1 traveling a cell indicated in phantom. Preferably, coverage by a base station of a downlink common channel or beacon channel matches that of dedicated channels using smart antennas.

Figure 1C:
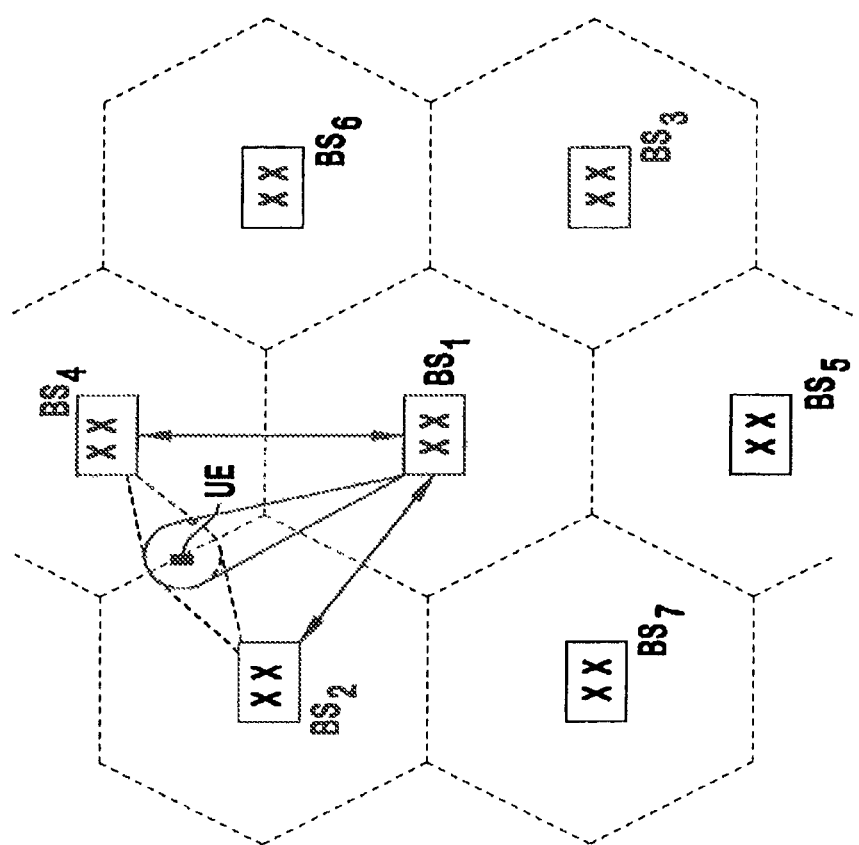
FIG. 1c illustrates a UE traveling through the cells covered by a network of Node B base stations of a 3GPP system that employ smart antennas.
Figure 1B:
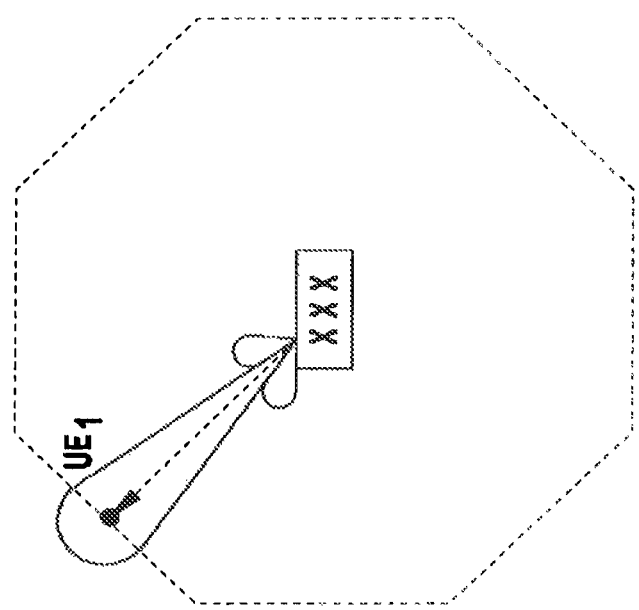
FIG. 1b illustrates a smart antenna of a Node B focused at a UE of a 3GPP system.

A pattern of mutually exclusive cells may be mapped to denote the overall coverage area of a wireless radio access network as illustrated in phantom in FIG. 1c. However, the actual geographic coverage area capable of being serviced by each base station normally extends beyond the nominal cell mapping and overlaps with the actual geographic coverage area of neighboring base stations. For, example in FIG. 1c, the mobile unit UE is depicted as being capable of being serviced by at least any of base stations $BS_1$, $BS_2$, or $BS_4$.

Figure 2:
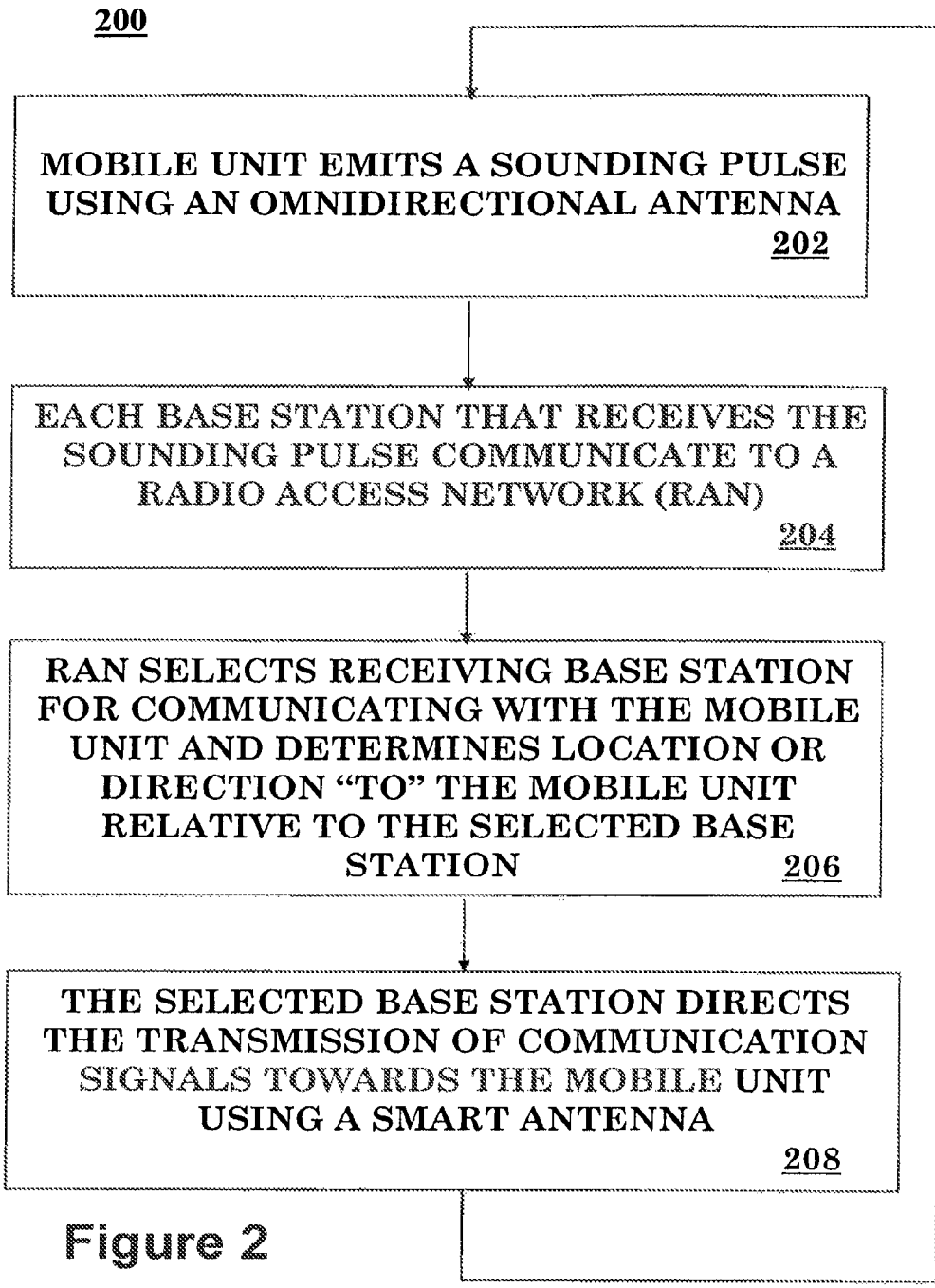
FIG. 2 is a flow diagram of a base station selection procedure in accordance with an embodiment of the present invention.

FIG. 2 is a flow diagram of a base station selection procedure in accordance with an embodiment of the present invention. In a first step 202, a mobile unit emits a sounding pulse using an omnidirectional antenna to produce a uniformly radiated radio frequency (RF) pattern. Each base station that receives the sounding pulse, communicates that information to a Radio Access Network (RAN) as indicated in step 204. For example, a sounding pulse emitted by mobile unit UE in FIG. 1c would most likely be received by base stations $BS_2$ and $BS_4$, but may also be received by base station $BS_1$ and possibly base stations $BS_6$ and $BS_7$ as well.

The receiving base stations may or may not be controlled by the same RNC. Where more than one RNC is involved, preferably the one that first receives a communication from one of its associated Node B base stations becomes the deciding RNC and has the reception of the sounding pulse information conveyed to it by the RNC(s) associated with the other base station(s) that receive the sounding pulse such as via a standard Iur interface as illustrated in FIG. 1a. Where a base station is in another UTRAN, communication to the deciding RNC may be made via the core network of an existing 3GPP system.

The RAN selects one of the pulse receiving base stations and determines the direction from the selected base station to the mobile unit as reflected in step 206. The selection decision is preferably based on the strength of the received signal. Where more than one base station receives the sounding pulse above a selected minimum strength, other standard quality of service (QoS) criteria may be compared in the selection process. Also, overall network traffic may be considered in the selection decision, such as disclosed in U.S. patent application Ser. No. 10/305,595 owned by the assignee of the present invention.

Where the deciding RNC is not the RNC directly associated with the selected base station, the selected base station's RNC may be used to determine the direction from the selected base station to the mobile unit. However, where overall network traffic is being evaluated, the RNC(s) may communicate all of the data to the core network and the core network may be utilized to assist in or make the base station selection. Such alternatives may be triggered when the communication traffic with respect to an RNC or UTRAN reach certain specified minimum levels. As intimated by FIG. 1c, even though base stations $BS_2$ and $BS_4$, are closer to mobile unit UE, base station $BS_1$ may possibly be selected based on QoS and overall network traffic considerations.

As indicated in step 208, once selected, the selected base station directs its transmission of downlink common channels towards the mobile unit as shown in FIG. 1b. The base station is preferably provided with a beamforming antenna for this purpose and the direction of the beam is preferably based on an estimate of the mobile unit's location. Directional antennas, phased array antennas, or other types of antenna systems may be provided, so that a beam from a base station antenna for transmission and/or reception covers a particular geographic area of a specific shape and size. The location estimate may be derived in a number of ways, but is preferably based upon information related to reception of the sounding pulse by one or more base stations. Quantitative measurements of beam strength and/or angle of reception from one or more base stations may be used in a conventional manner to calculate a relative mobile unit location. In a 3GPP type system, this may be done at either the RNC or the Node B. Alternatively, geolocation data may be attached to the sounding pulse by the mobile unit and a relative position determined by comparison with the known location of the selected base station's antenna. The mobile unit may be equipped with a Global Positioning System (GPS) for this purpose.

The sounding pulse is a physical signal that is preferably transmitted using an isotropic antenna, which is an antenna that radiates or receives equally in all directions. The form of the sounding pulse is preferably dependent on the radio access technology. For example, in CDMA-based systems, a very short duration burst spanning multiple chips, a short chip sequence, may represent the sounding pulse.

The timing for the sounding pulse depends on the implementation and realization of the physical signal, which depends on radio access technology. Each wireless communication medium requires a different pulse timing structure. For example, a FDD-CDMA sounding pulse would be different than a TDD-CDMA sounding pulse.

The physical signal that defines the sounding pulse itself may be realized with an Aloha or slotted Aloha technique. In an Aloha-like technique, the mobile unit simply transmits the sounding pulse burst whenever it wants to. There are no timing restrictions in the Aloha-like system. If the mobile unit does not get a response from a base station, this is considered a "connect" failure. A back-off procedure is then implemented. This procedure essentially retries to connect after the mobile unit waits a random amount of time until retransmitting.

In the slotted Aloha-like technique, the mobile unit transmits the sounding pulse at specific timeslots. This technique requires some sort of master timing. In case of failure, the back-off procedure corresponds to a mobile unit waiting a random number of timeslots until which the mobile unit retransmits.

In some situations, multiple mobile units may pulse at the same time to acquire the attention of the same RAN. When this occurs and the Node Bs may differentiate the signals from both mobile units, the RAN selects Node Bs to direct common channels towards each mobile unit. If the Node Bs may not differentiate the signals from each mobile unit, the RAN may not make a proper Node B selection to direct the common channels toward each mobile unit. In this case, the selection preferably awaits the next pulse transmitted by each mobile unit. To ensure that subsequent pulses from these mobile units do not collide, a preferred back-off procedure for the mobile units includes waiting a random amount of time before retransmitting a sounding pulse, thus avoiding another collision. Successive pulses may be at increased power as discussed in the variation below.

Figure 3:
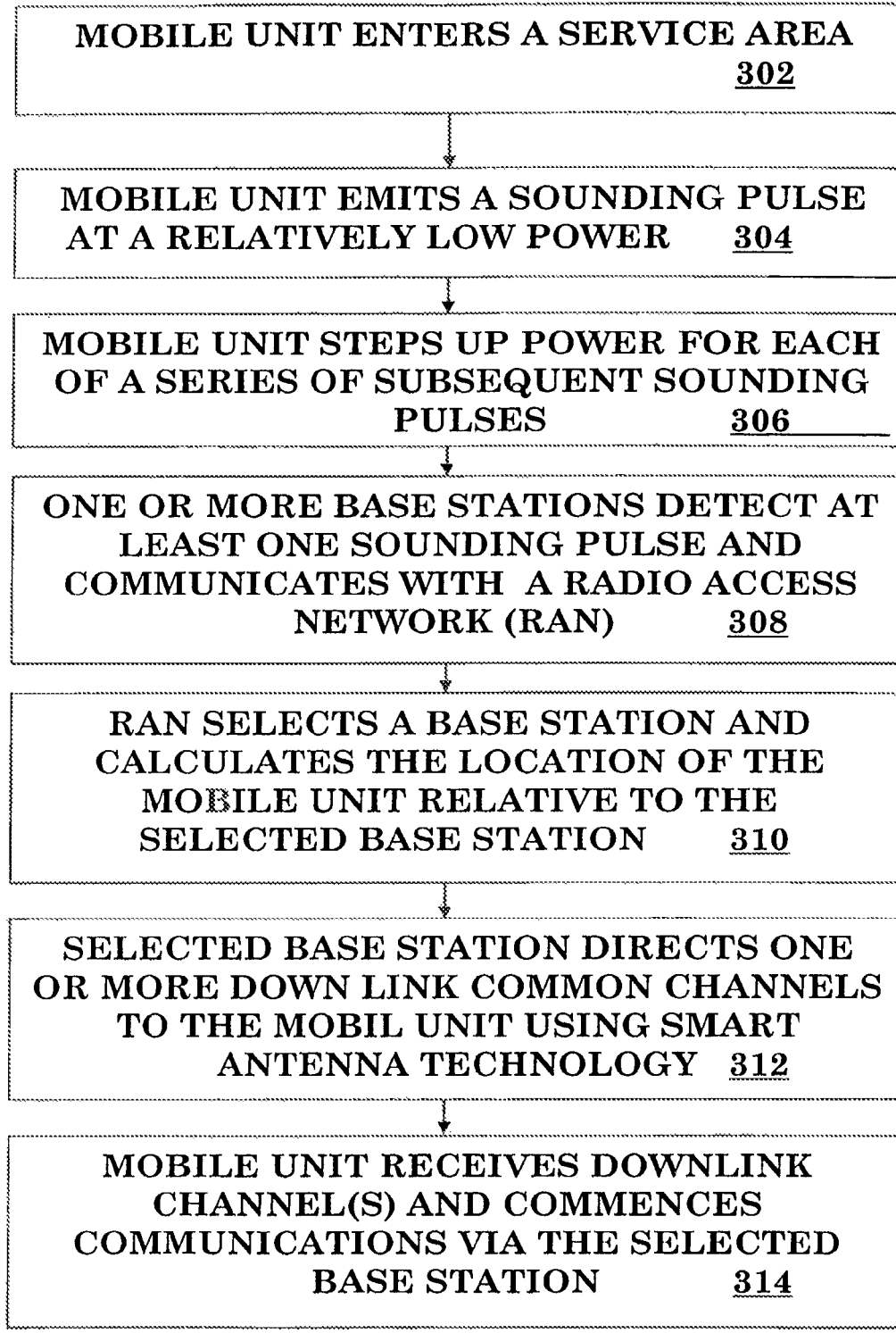
FIG. 3 is a flow diagram of a base station selection procedure variation in accordance with an embodiment of the present invention.

A variation of the procedure illustrated in FIG. 2 is set forth in FIG. 3. Once the mobile unit enters a network service area, step 302, it emits a first sounding pulse at a low power, step 304. However, instead of a single pulse, the mobile unit emits a series of pulses and gradually steps up the transmission power during the emission of the series of sounding pulses, step 306. Preferably, each successive pulse is transmitted with a greater power than its immediate predecessor pulse.

One or more base stations which each detect at least one sounding pulse, communicates its sounding pulse reception information to a RAN, step 308. The RAN selects one of the base stations and calculates the relative location of the mobile unit, step 310. The selected base station then directs one or more downlink common channels to the mobile unit using smart antenna technology, step 312. The mobile unit then receives the downlink channels and may then commence communications with another unit via the selected base station, step 314.

In either embodiment, upon detection of a sounding pulse, the radio access network (RAN) preferably uses measurements performed on the sounding pulse to subsequently direct the selected base station's transmission of one or many downlink common channels using a smart antenna. For example, the received signal power of the sounding pulse and the angle of arrival of the signal relative to a single base station may be used to determine the position of the mobile unit and the direction towards which common channels should be radiated using smart antennas. However, the RNC may correlate data received from all of the base stations that communicate reception of the sounding pulse to make a more accurate calculation of the mobile unit's geographic location.

A mobile unit preferably makes its presence known to a RAN upon power-up or when entering a UTRAN service area. Accordingly, the base stations must listen for sounding pulses at regular time intervals or continuously in order to detect the emergence of new mobile units. In addition, in order to maintain a relationship with a particular base station, mobile units that are camped out on a particular base station, i.e., not actively conducting communications, preferably schedule periodic pulses to ensure tracking of the location of the mobile unit so communications directed to such mobile unit may be promptly connected.

In order to facilitate the transmission and detection of the sounding pulse, certain downlink common channels providing timing information with respect to access opportunities for the uplink sounding pulse may be transmitted using omnidirectional antennas. However, this is preferably only performed if the coverage of such synchronization channels may be assured without sacrificing downlink capacity.

In a variation of the FIG. 3 embodiment, a series of sounding pulses are sent according to a power ramp-up procedure as follows. A mobile unit transmits an initial sounding pulse at a low power level as in step 304. After a period of time without reception of a reply from a base station, the mobile unit will step up the transmitted power and retry its sounding pulse. The procedure is repeated until a sufficient downlink communication from a base station is received. In other words, step 306 is skipped, or stopped, once steps 308, 310 and 312 are performed. The amount of time until the transmission of a "stepped-up" higher power sounding pulse may either be fixed or determined from a random back-off process performed by the mobile unit. Additionally, the amount of power increase for each step may also be fixed or variable.

In addition to or as an alternative to transmitting a sounding pulse upon entry into a service area, the mobile unit may be configured to transmit a sounding pulse when the received signal code power (RSCP) of one or more selected common channels falls below a certain threshold level. Also, once the radio access network has determined the location of the mobile unit, registration and authentication information is preferably exchanged between the network and the mobile unit. Network registration is preferably performed using conventional protocols as in current wireless systems.

While the invention relates to the usage of smart antennas on the downlink of the common channels, uplink registration and authentication information is not required to be transmitted using smart antennas. During further idle mode operation, which includes monitoring of pages, updates of system and broadcast information, network synchronization and other procedures are ensured through a mechanism that employs sounding pulses to track displaced mobiles. A displaced mobile is a mobile unit that has moved out from beneath the penumbra of the focused antenna of the base station that had been selected for communication with the mobile unit.

As in discontinuous reception for conventional UMTS systems, an idle-mode mobile unit must "wake-up" and acquire one or many common channels, such as paging channels or updates to system information on a broadcast channel (BCH). If the received power on desired common channel(s) is insufficient, the mobile unit may be configured to transmit a sounding pulse such that the radio access network may redirect the transmission of common channels using a base station's smart antenna.

Another application is realized for mobile units which employ a conventional DRX cycle. A DRX cycle is a mode a mobile unit reverts to when it loses contact with the network. If a mobile unit becomes disconnected from the network, the mobile unit will preferably periodically transmit a sounding pulse every DRX cycle prior to the acquisition of common channels in accordance with the invention as described above.

As a mobile unit traverses through a coverage area and more specifically upon leaving the coverage area of a given cell, there is a need for reselection of an appropriate base station for facilitating communications with the mobile unit. This may be done in accordance with the process described above using a base station interface device such as a 3GPP RNC. As an alternative, a mobile unit may be configured to be capable of selecting or reselecting a base station itself.

Figure 4:
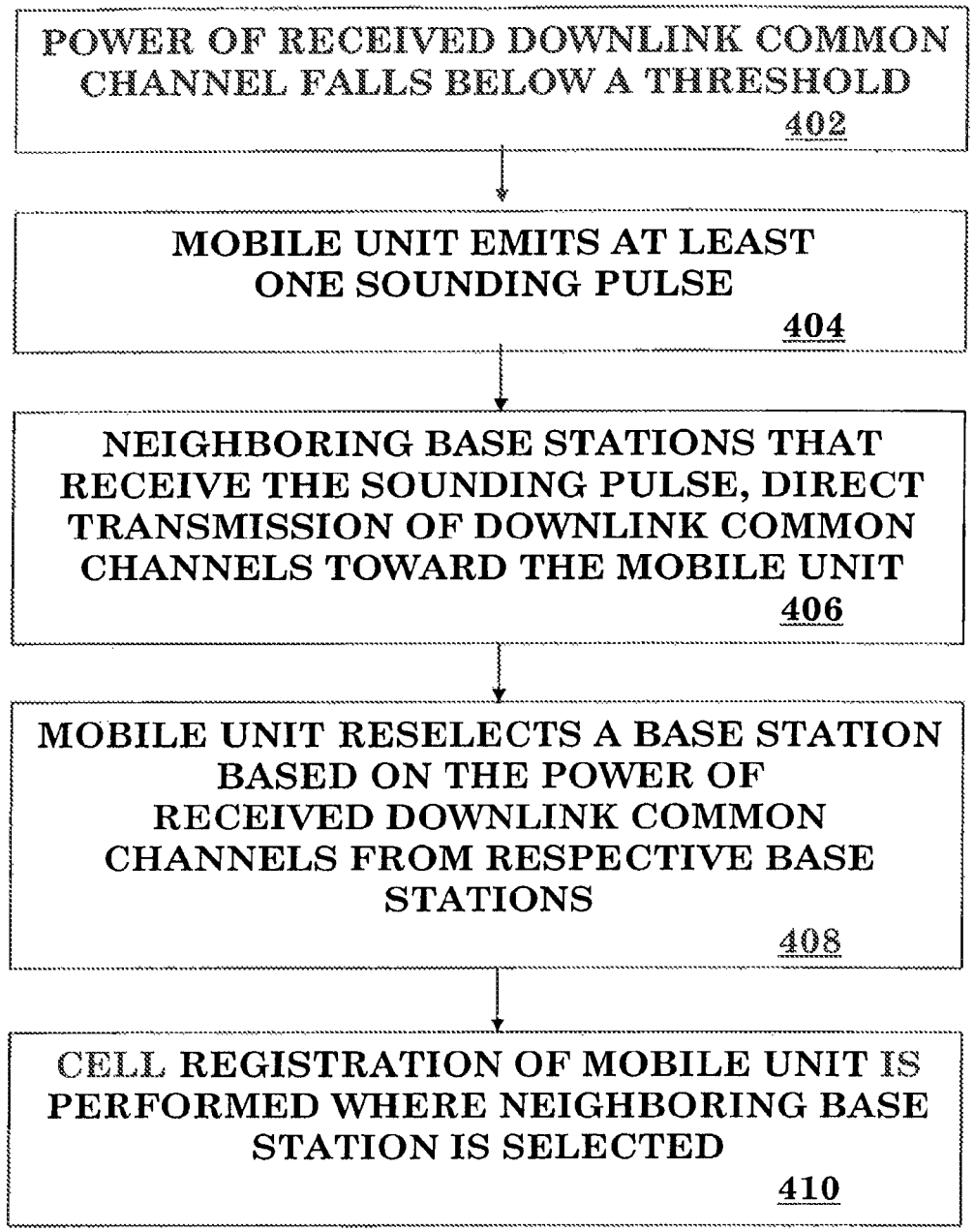
FIG. 4 is a flow diagram of a reselection procedure in accordance with an embodiment of the present invention.

While a mobile unit self-selection is equally applicable for initiating wireless communication, a mobile unit self-selecting reselection procedure in accordance with the second embodiment of the present invention is set forth in FIG. 4. In the case of reselection, the mobile unit monitors the received power of a downlink common channel transmitted by a currently selected base station to determine if it drops below a pre-selected threshold, step 402. When the threshold is passed, the mobile unit transmits a sounding pulse, step 404. Upon reception of the sounding pulse, neighboring base stations that receive the pulse direct the transmission of downlink common channels toward the mobile unit, step 406.

FIG. 1*c* represents the case where base station $BS_1$ was previously selected for servicing communications for mobile unit UE which has emitted a sounding pulse after moving out of the nominal cell serviced by that base station. The figure illustrates base stations $BS_2$ and $BS_4$ having received the pulse, directing downlink common channels, for example a beacon channel, toward mobile unit UE. In this alternate embodiment, the mobile unit selects a base station based upon a comparison of the reception of downlink common channels from such neighboring base stations, step 408. Preferably, a cell registration process is then performed via the newly selected base station to properly redesignate the mobile units location with respect to the network, step 410.

The radio access network may control which cell a mobile unit selects by virtue of its control of the base station transmissions. Upon reception of the sounding pulse from multiple base stations, a RNC may estimate the location of the mobile unit using triangulation techniques and measurements from all base stations on the sounding pulse. The radio network controller may utilize the location of the mobile unit to direct the transmission of common channels from only one base station, i.e., the one to which the RNC chooses that the mobile unit should select. This type of control is particularly useful when evaluating overall network usage and capacity of particular Node Bs so in order to provide a better utilization of network resources at a given time.

The sounding pulses may be generated at a frequency outside normal uplink and downlink telecom frequencies, thereby alleviating frequency congestion. For example, in a current deployment of CDMA, the mobile units are normally assigned channels at least 1.25 MHz apart, providing about 42 channels under current frequency allocation scheme. Typically, the uplink transmit frequency is 45 MHz lower than the downlink transmit frequency. The sounding pulses are preferably then assigned to a frequency in close proximity to the uplink or downlink, but not on the same frequency as either the uplink or downlink transmissions.

Normally the sounding pulse is preferably a simple short signal, containing no specific information, but optionally the sounding pulse may contain identification information from the mobile unit. With such information, the base stations may readily determine and distinguish between pulses concurrently received from more than one mobile unit. This information may indicate the reason for which the mobile wants to connect to the network. For example, the mobile unit may want to simply register with the network or it may wish to set up a call.

Other variations and alternatives will be apparent to those skilled in the art and are considered to be within the scope of the present invention.

What is claimed is:

1. A wireless transmit/receive unit (WTRU), comprising:
a receiver and a processor configured to receive information from a network node indicating an assignment of periodic time intervals to transmit sounding signals; and
a transmitter and the processor configured to transmit sounding signals to the network node in the assigned periodic time intervals in response to the received information, wherein the WTRU does not transmit any data at a same time that the WTRU transmits the sounding signals, wherein the transmitted sounding signals from the WTRU are distinguishable from sounding signals from other WTRUs.

2. The WTRU according to claim 1, further comprising:
the receiver and the processor are further configured to simultaneously receive a plurality of downlink transmissions from a plurality of cells.

3. The WTRU according to claim 1, wherein the transmitter and the processor transmit the sounding signals in a frequency division duplex (FDD) mode.

4. The WTRU according to claim 1, wherein the transmitter and the processor transmit the sounding signals in a time division duplex (TDD) mode.

5. The WTRU according to claim 1, wherein a timing of transmission of the sounding signals in response to the received information in a time division duplex (TDD) mode differs from a timing of transmission of the sounding signals in response to the received information in a frequency division duplex (FDD) mode.

6. A method, comprising:
receiving information from a network node by a wireless transmit/receive unit (WTRU), the information indicating an assignment of periodic time intervals to transmit sounding signals; and
transmitting sounding signals by the WTRU to the network node in the assigned periodic time intervals in response to the received information, wherein the WTRU does not transmit any data at a same time that the WTRU transmits the sounding signals, wherein the transmitted sounding signals are distinguishable from sounding signals from other WTRUs.

7. The method according to claim 6, further comprising:
simultaneously receiving a plurality of downlink transmissions from a plurality of cells.

8. The method according to claim 6, wherein the transmitted sounding signals are transmitted in a frequency division duplex (FDD) mode.

9. The method according to claim 6, wherein the transmitted sounding signals are transmitted in a time division duplex (TDD) mode.

10. The method according to claim 6, wherein a timing of transmission of the sounding signals in response to the received information in a time division duplex (TDD) mode differs from a timing of transmission of the sounding signals in response to the received information in a frequency division duplex (FDD) mode.

11. A wireless device comprising:
a transmitter and a processor configured to transmit information to a wireless transmit/receive unit (WTRU) indicating an assignment of periodic time intervals to transmit sounding signals; and
a receiver and the processor configured to receive sounding signals from the WTRU in the assigned periodic time intervals in response to the transmitted information, wherein the wireless device does not receive any data from the WTRU at a same time that the wireless device receives the sounding signals from the WTRU, wherein the received sounding signals from the WTRU are distinguishable from sounding signals from other WTRUs.

12. The wireless device according to claim 11, further comprising:
the transmitter and the processor are further configured to transmit downlink transmissions simultaneously with a plurality of downlink transmissions from a plurality of cells.

13. The wireless device according to claim 11, wherein the receiver and the processor are configured to receive the sounding signals in a frequency division duplex (FDD) mode.

14. The wireless device according to claim 11, wherein the receiver and the processor are configured to receive the sounding signals in a time division duplex (TDD) mode.

15. The wireless device according to claim 11, wherein a timing of transmission of the sounding signals in response to the received information in a time division duplex (TDD) mode differs from a timing of transmission of the sounding signals in response to the received information in a frequency division duplex (FDD) mode.

* * * * *

UNITED STATES PATENT AND TRADEMARK OFFICE
CERTIFICATE OF CORRECTION

PATENT NO. : 9,844,055 B2  
APPLICATION NO. : 15/221904  
DATED : December 12, 2017  
INVENTOR(S) : Cave et al.

Page 1 of 1

It is certified that error appears in the above-identified patent and that said Letters Patent is hereby corrected as shown below:

In the Specification

At Column 1, Line 27, after "that" delete "supporting" and insert --support--.

At Column 1, Line 44, delete "device" and insert --devices--.

At Column 2, Line 29, after "that" delete "to minimalize" and insert --minimizes--.

At Column 2, Line 52, after "3GPP" delete "broad cast" and insert --broadcast--.

At Column 6, Line 64, after "traveling" insert --through--.

At Column 10, Line 61, after "mobile" delete "units" and insert --unit's--.

Signed and Sealed this  
Twenty-ninth Day of May, 2018

Andrei Iancu  
*Director of the United States Patent and Trademark Office*